United States Patent
Lin et al.

(10) Patent No.: US 8,486,749 B2
(45) Date of Patent: Jul. 16, 2013

(54) MICRO/NANOSTRUCTURE PN JUNCTION DIODE ARRAY THIN-FILM SOLAR CELL AND METHOD FOR FABRICATING THE SAME

(75) Inventors: Ching-Fuh Lin, Taipei (TW); Jiun-Jie Chao, Taipei (TW); Shu-Chia Shiu, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 13/295,205

(22) Filed: Nov. 14, 2011

(65) Prior Publication Data
US 2012/0058593 A1 Mar. 8, 2012

Related U.S. Application Data

(62) Division of application No. 12/318,356, filed on Dec. 29, 2008, now Pat. No. 8,258,396.

(30) Foreign Application Priority Data

Aug. 29, 2008 (TW) .............................. 97133261 A

(51) Int. Cl.
*H01L 21/00* (2006.01)
*H01L 31/042* (2006.01)
(52) U.S. Cl.
USPC .................. 438/73; 438/67; 438/89; 136/255
(58) Field of Classification Search
USPC ........................... 438/57, 67, 74, 89; 136/255
See application file for complete search history.

(56) References Cited

U.S. PATENT DOCUMENTS

| | | | |
|---|---|---|---|
| 6,283,812 B1 * | 9/2001 | Jin et al. | 445/24 |
| 6,649,824 B1 * | 11/2003 | Den et al. | 136/256 |
| 8,048,344 B2 * | 11/2011 | Lin et al. | 264/1.37 |
| 8,053,025 B2 * | 11/2011 | Lin et al. | 427/74 |
| 8,258,396 B2 * | 9/2012 | Lin et al. | 136/255 |
| 2005/0061451 A1 * | 3/2005 | Busnaina et al. | 156/598 |
| 2005/0066883 A1 * | 3/2005 | Dubrow et al. | 117/68 |
| 2005/0233546 A1 * | 10/2005 | Oohata et al. | 438/458 |
| 2006/0006463 A1 * | 1/2006 | Islam et al. | 257/347 |
| 2008/0283269 A1 * | 11/2008 | Graham et al. | 174/98 |
| 2009/0298259 A1 * | 12/2009 | Ling et al. | 438/458 |
| 2010/0055824 A1 * | 3/2010 | Lin et al. | 438/73 |
| 2011/0012505 A1 * | 1/2011 | Lin et al. | 313/504 |
| 2011/0315201 A1 * | 12/2011 | Lin et al. | 136/255 |
| 2012/0058593 A1 * | 3/2012 | Lin et al. | 438/73 |

* cited by examiner

*Primary Examiner* — David Vu
*Assistant Examiner* — Earl Taylor
(74) *Attorney, Agent, or Firm* — Rosenberg, Klein & Lee

(57) ABSTRACT

The present invention discloses a micro/nanostructure PN junction diode array thin-film solar cell and a method for fabricating the same, wherein a microstructure or sub-microstructure PN junction diode array, such as a nanowire array or a nanocolumns array, is transferred from a source-material wafer to two pieces of transparent substrates, which are respectively corresponding to two electric conduction types, to fabricate a thin-film solar cell. In the present invention, the micro/nanostructure PN junction diode array has advantages of a fine-quality crystalline semiconductor, and the semiconductor substrate can be reused to save a lot of semiconductor material. Besides, the present invention can make the best of sunlight energy via stacking up the solar cells made of different types of semiconductor materials to absorb different wavebands of the sunlight spectrum.

12 Claims, 8 Drawing Sheets

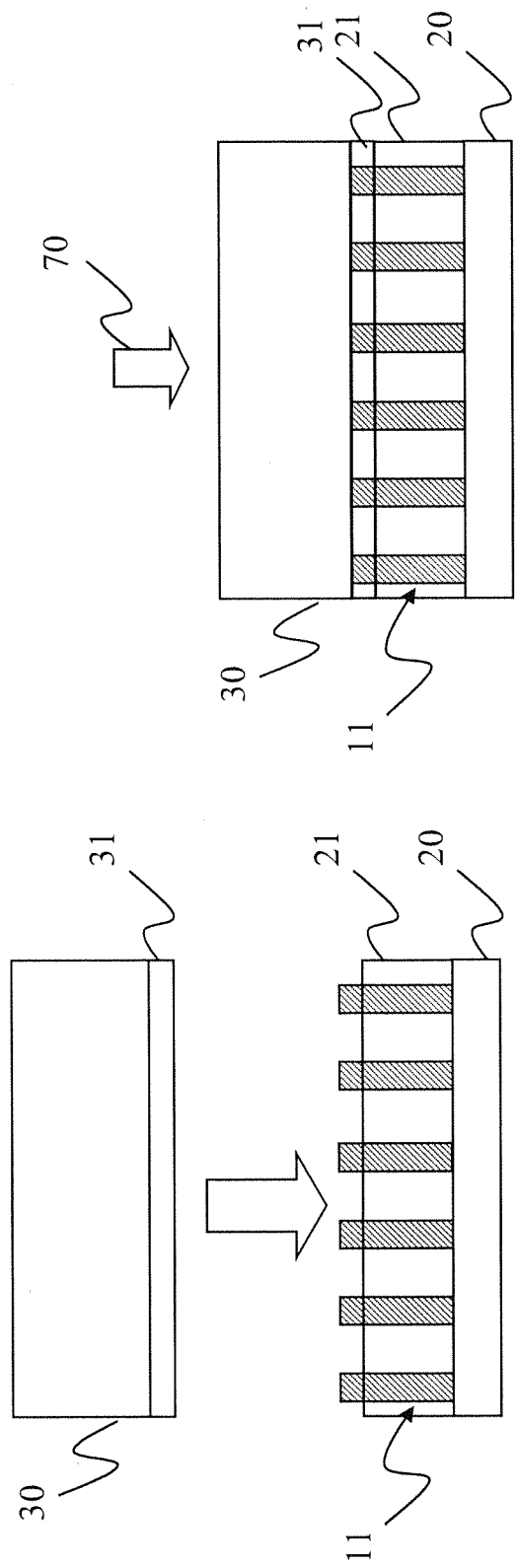

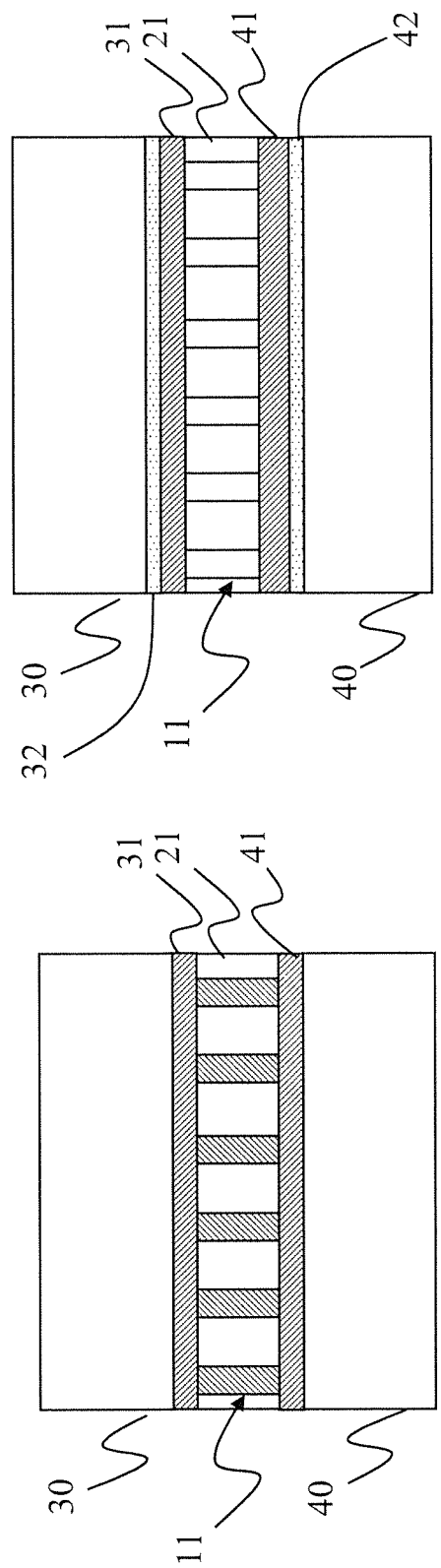

MICRO/NANOSTRUCTURE PN JUNCTION DIODE ARRAY THIN-FILM SOLAR CELL AND METHOD FOR FABRICATING THE SAME

RELATED APPLICATIONS

This application is a Divisional patent application of co-pending application Ser. No. 12/318,356, filed on 29 Dec. 2008, now pending. The entire disclosure of the prior application Ser. No. 12/318,356, from which an oath or declaration is supplied, is considered a part of the disclosure of the accompanying Divisional application and is hereby incorporated by reference.

BACKGROUND OF THE INVENTION

1. Field of the Invention

The present invention relates to a thin-film solar cell, particularly to a micro/nanostructure PN junction diode array thin-film solar cell and a method for fabricating the same.

2. Description of the Related Art

Petroleum is going to be exhausted by the end of this century, and the voice for substitute energies has been cried for a long time. Substitute energies include wind power, wave power, and biofuel. Among them, solar energy has relative higher market acceptability, and many nations have been devoted to the development of solar energy. The German Advisory Council on Global Change predicted that solar energy will provide about 60% of the total energy in 2100. Solar energy is generated by the photovoltaic effect, wherein solar energy material directly converts sunlight into electric energy. The crystalline silicon solar cell has been developed for tens of years, and the related technologies thereof have been very mature. Generally, the monocrystalline silicon solar cell has an energy conversion efficiency of as high as about 20%. However, the fabrication cost thereof is too high to popularize solar energy. The topics of solar energy researches would be developing new materials, processes and systems to promote the energy conversion efficiency and reduce the cost of solar energy.

The thin-film solar cell has become an important technical trend because of low cost. The thin-film solar cell adopts a lightweight, flexible and impact-resistant material as the substrate to replace the traditional hard, heavy and thick silicon substrate and creates a new opportunity to exploit solar energy. The flexible solar panel not only has a cheap price but also has diversified applications, such as the applications in BIPV (Building Integrated Photovoltaics), vehicles, boats, portable power supplies (for mobile phones or notebook computers), consumer electronics, and fabrics (e.g. clothes, curtains, sun shelters, and bags). Besides, the flexible substrate can be integrated with a roll-to-roll manufacture process to produce low-cost and large-area solar cells.

Among various types of thin-film solar cells, the amorphous silicon solar cell is a more mature technology. The amorphous solar cell usually has a p-i-n structure, wherein the p layer and n layer are to establish an inner electric field, and the i layer is formed of amorphous silicon. The i layer has a thickness of only 0.2-0.5 μm and absorbs photons of 1.1-1.7 eV, which is different from 1.1 eV photons absorbed by wafer silicon. It is inappropriate for the i layer to have too great a thickness because a thick i layer increases the probability of electron-hole recombination. However, too thin an i layer absorbs insufficient sunlight energy. Therefore, the amorphous solar cell usually adopts a multi-layer stack design to overcome the dilemma. The unsaturated silicon atoms of amorphous silicon will be structurally changed by sunlight radiation. Therefore, the amorphous silicon solar cell has a main intrinsic problem that the performance thereof will decline quickly and obviously after sunlight radiation and has SWE (Staebler-Wronski Effect) of 15-35%. The multi-layer stack design can also offset the lower SWE value. In the fabrication of the amorphous silicon solar cell, a silicon film is formed with a PECVD (Plasma Enhanced Chemical Vapor Deposition) method; the substrate may adopt a stainless steel plate or a plastic material. The fabrication of the amorphous silicon solar cell uses a roll-to-roll process. However, the deposition is very slow. Additionally, the high-quality electrically-conductive glass is very expensive. Thus, the price of the amorphous silicon solar cell is only slightly lower than that of the crystalline solar cell. Although the multi-layer stack design can increase the efficiency of the solar cell, it also increases the cost. The amorphous silicon solar cell has two main weaknesses of low photoelectric conversion efficiency and poor reliability. For the amorphous silicon solar cell, it has an efficiency of 13.5% in laboratories and an efficiency of only 4-8% in commercial applications, which is far below the efficiency of the monocrystalline or polycrystalline silicon solar cell.

The polycrystalline silicon solar cell is the mainstream of the market, and 90% of the market is occupied by the polycrystalline silicon solar cell and the monocrystalline silicon solar cell. Polycrystalline silicon has an energy gap of about 1.12 eV and absorbs light having a wavelength of between 350 to 1100 nm. Polycrystalline silicon has a pretty wide absorption spectrum. However, polycrystalline silicon is a semiconductor material having an indirect energy gap. Therefore, in the electron transition from a valence band to a conduction band, additional dynamic energy must be supplied to phonons so that electrons can jump to the conduction band. As polycrystalline silicon has numerous grain boundaries, polycrystalline silicon is harder to cut than amorphous silicon or monocrystalline silicon.

The performance of the monocrystalline silicon solar cell is similar to that of the polycrystalline silicon solar cell. However, the monocrystalline silicon solar cell is less damaged by solar radiation than the polycrystalline silicon solar cell. With the photoelectric conversion efficiency unchanged, the monocrystalline silicon solar cell has a service life of as long as 20 years on the surface of the earth. At present, US, Germany and Japan all have solar power plants using monocrystalline silicon, and many nations are planning their monocrystalline silicon test solar power plant. The monocrystalline silicon is indeed very important for the development of photovoltaic power generation systems. However, the high price of monocrystalline silicon impairs the application thereof.

Both the solar cells of monocrystalline silicon and polycrystalline silicon consume a lot of silicon material, but refining high-quality silicon material is a very energy-consuming process. Consequently, the silicon material usually has a cost higher than that of the process of fabricating solar cells. Therefore, reducing material consumption is a very important subject for exploiting solar energy.

SUMMARY OF THE INVENTION

The primary objective of the present invention is to provide a micro/nanostructure PN junction diode array thin-film solar cell and a method for fabricating the same, wherein the solar cell is fabricated via etching a high-crystallinity chip and has advantages of a fine-quality semiconductor material, and wherein the semiconductor substrate can be reused after the diode arrays are detached from the semiconductor substrate, whereby a lot of semiconductor material is saved, and whereby the conventional problems are virtually solved.

The present invention proposes a micro/nanostructure PN junction diode array thin-film solar cell and a method for fabricating the same, wherein a semiconductor micro/nanostructure array is formed on a source-material wafer with an epitaxial method, a doping method or an etching method, and then the semiconductor micro/nanostructure array is transferred from the source-material wafer to two transparent substrate corresponding to two electric-conduction types to form a thin-film solar cell having advantages of a high-quality crystalline semiconductor material. In the present invention, the semiconductor substrate can be reused to save a lot of semiconductor material.

The micro/nanostructure PN junction diode array thin-film solar cell disclosed by the present invention comprises in sequence a first transparent substrate, a thin-film N-type semiconductor, a semiconductor micro/nanostructure array, a thin-film P-type semiconductor, and a second transparent substrate. The diode array of the thin-film solar cell is fabricated via etching a high-crystallinity chip and has advantages of a fine-quality semiconductor material. After the diode array is separated from the original semiconductor substrate, the original semiconductor substrate can be reused to save a lot of semiconductor material. The present invention can overcome the bottleneck that many inorganic semiconductor materials are too fragile or too expensive to produce a large-area element. The present invention can provide a flexible, lower-cost, and larger-area thin-film solar cell.

In one embodiment of the present invention, several thin-film solar cells made of different semiconductor materials are stacked up to respectively absorb different wavebands of the sunlight spectrum. Thus, the stack of thin-film solar cells of the present invention can absorb almost the full spectrum of sunlight and make the best of sunlight energy. The solar cell stack of the present invention needn't consider the lattice matching problem of crystal growth and is more easy-to-fabricate than the conventional III-V group tandem solar cell. Thus, a plurality of micro/nanostructure PN junction diode array thin-film solar cells of the present invention can be stacked to fully exploit sunlight energy.

The method for fabricating micro/nanostructure PN junction diode array thin-film solar cell disclosed by the present invention comprises steps: providing a source-material wafer having a semiconductor micro/nanostructure array; coating a thin-film N-type semiconductor on a first transparent substrate; making the semiconductor micro/nanostructure array contact the thin-film N-type semiconductor of the first transparent substrate; fusing together the thin-film N-type semiconductor and one end of the semiconductor micro/nanostructure array with an intense laser light; detaching the semiconductor micro/nanostructure array and transferring the semiconductor micro/nanostructure array to the first transparent substrate; coating a thin-film P-type semiconductor on a second transparent substrate; making the semiconductor micro/nanostructure array contact the thin-film P-type semiconductor of the second transparent substrate; and fusing together the thin-film P-type semiconductor and another end of the semiconductor micro/nanostructure array with an intense laser light to form the micro/nanostructure PN junction diode array thin-film solar cell of the present invention.

The present invention not only breaks through the bottleneck that many inorganic semiconductor materials are too fragile or too expensive to produce a large-area element but also provides a flexible, lower-cost, and larger-area thin-film solar cell. The diode array of the thin-film solar cell is fabricated via etching a high-crystallinity chip and has advantages of a fine-quality semiconductor material. After the diode array is separated from the original semiconductor substrate, the original semiconductor substrate can be reused to save a lot of semiconductor material. In the present invention, several thin-film solar cells made of different semiconductor materials are stacked up to respectively absorb different wavebands of the sunlight spectrum. Thus, the stack of thin-film solar cells of the present invention can absorb almost the full spectrum of sunlight and make the best of sunlight energy. The solar cell stack of the present invention needn't consider the lattice matching problem of crystal growth and is more easy-to-fabricate than the conventional III-V group tandem solar cell that is hard to fabricate and expensive. Therefore, the micro/nanostructure PN junction diode array thin-film solar cell of the present invention has a superior competitiveness because of its low cost and high photoelectric conversion efficiency.

Below, the embodiments of the present invention are described in detail in cooperation with the drawings to make easily understood the objectives, characteristics and functions of the present invention.

BRIEF DESCRIPTION OF THE DRAWINGS

FIGS. 3A-3G are diagrams schematically showing a method for fabricating a micro/nanostructure PN junction diode array thin-film solar cell according to one embodiment of the present invention;

FIG. 4 is a diagram schematically showing that mesh-like metal electrodes are additionally formed in the micro/nanostructure PN junction diode array thin-film solar cell according to one embodiment of the present invention.

DETAILED DESCRIPTION OF THE INVENTION

Refer to from FIG. 1A to FIG. 1H diagrams schematically showing a method for transferring a semiconductor micro/nanostructure array according to one embodiment of the present invention.

Figure 1A:
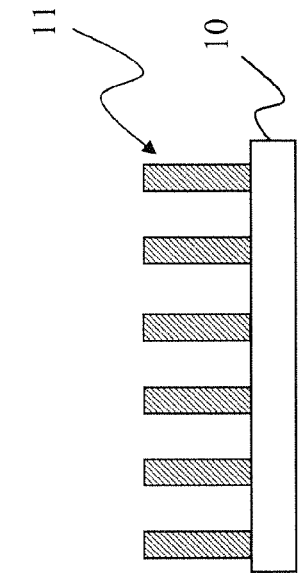
FIGS. 1A-1H are diagrams schematically showing a method for transferring a semiconductor micro/nanostructure array according to one embodiment of the present invention.
Figure 1B:
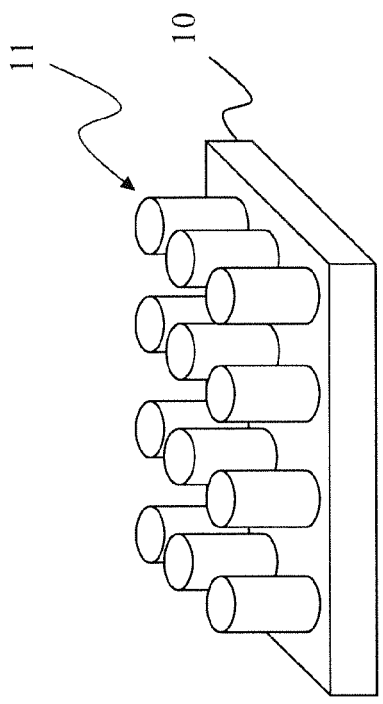

As shown in FIG. 1A and FIG. 1B, a source-material wafer 10 having a semiconductor micro/nanostructure array 11 is provided firstly. The semiconductor micro/nanostructure array 11 is made of an arbitrary semiconductor, such as an elemental semiconductor, a binary compound semiconductor, or a multi-component compound semiconductor (e.g. silicon, germanium, gallium arsenide, indium phosphide, gallium phosphide, antimony selenide, etc.). The longitudinal section of the semiconductor micro/nanostructure array 11 has a width of from 1 nm to 3000 µm and a length of from 50 nm to 50 µm. The length and width of the micro/nanostructure array 11 may vary with the absorption coefficient of the material. The source-material wafer 10 is made of an elemental semiconductor, a binary compound semiconductor, or a multi-component compound semiconductor, such as silicon, germanium, gallium arsenide, indium phosphide, gallium phosphide, gallium antimonide, zinc telluride, or an epitaxial chip that can be used to fabricate a solar cell.

In fabricating the semiconductor micro/nanostructure array 11, a P-type semiconductor layer and an N-type semiconductor layer are beforehand formed on the source-material wafer 10 with an epitaxial method or a doping method, and then the P-type semiconductor layer and the N-type semiconductor layer are etched to form arrayed structures. Alternatively, the source-material wafer 10 is beforehand etched to form an arrayed structure, and then a P-type semiconductor layer and an N-type semiconductor layer are formed on the arrayed structure with an epitaxial method or a doping method. Alternatively, nanowires, nanocolumns, microstructures, or submicrostructures, which have different-conductivity semiconductor materials, are directly grown on the substrate with a high-quality crystal growth process. The etching method may be a dry etching method, a wet etching method, a physical etching method, a chemical etching method, or a combination of two of the abovementioned methods. The mask used in etching may be a photoresist patterned with a photolithographic technology, spin-coated nanoparticles, nanoislands formed via rapidly annealing a coated metal film, a template fabricated with an AAO (Anodic Aluminum Oxide) method, a template fabricated with a CVD (Chemical (including electrochemical) Vapor Deposition) method.

Figure 1C:
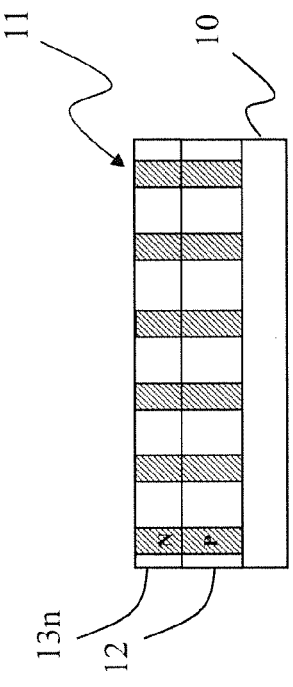
Figure 1D:
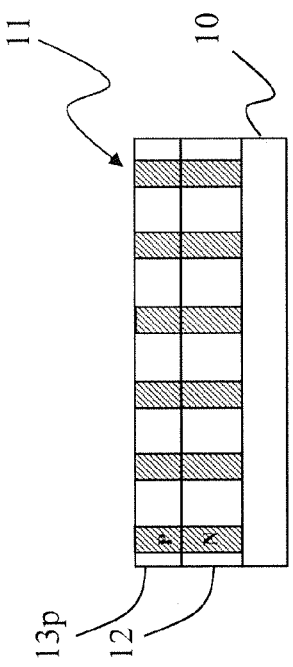

When an epitaxial method is used to fabricate the PN-diode semiconductor micro/nanostructure array 11 from the source-material wafer 10, an epitaxial layer having a conductivity different from the conductivity of the source-material wafer 10 is beforehand grown on the source-material wafer 10. In other words, a P-type epitaxial layer is grown on an N-type semiconductor, or an N-type epitaxial layer is grown on a P-type semiconductor. Then, an etching method is used to fabricate nanowires, nanocolumns, microstructures, or submicrostructures. When a doping method is used fabricate the micro/nanostructure PN junction diode array 11, an SOG (Spin-On-Glass) 12 is beforehand coated over the semiconductor micro/nanostructure array 11 and then baked and slightly etched to reveal the tops of the semiconductor micro/nanostructure array 11, as shown in FIG. 1C. Next, an SOD (Spin-On-Dopant) is coated on the revealed semiconductor micro/nanostructure array 11 and then heated to make the top of the semiconductor micro/nanostructure array 11 have a different conductivity. If the original semiconductor micro/nanostructure array 11 are of the N type conductivity, a P-type SOD 13$p$ is coated and heated to make the top of the semiconductor micro/nanostructure array 11 have the P-type conductivity, as shown in FIG. 1C. If the original semiconductor micro/nanostructure array 11 are of the P type conductivity, an N-type SOD 13$n$ is coated and heated to make the top of the semiconductor micro/nanostructure array 11 have the N-type conductivity, as shown in FIG. 1D. In addition to the abovementioned PN junction diode array, the semiconductor micro/nanostructure array 11 may be singly of the P-type or N-type conductivity. The abovementioned P-type or N-type SOD 13$p$ or 13$n$ is removed after the P-type or N-type semiconductor is formed.

Figure 1E:
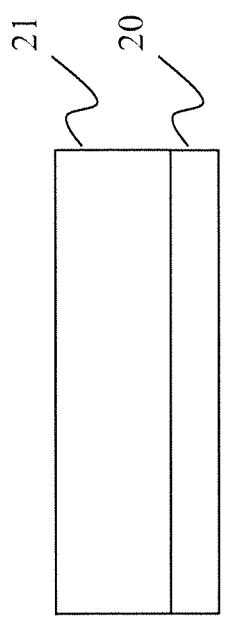
Figure 1F:
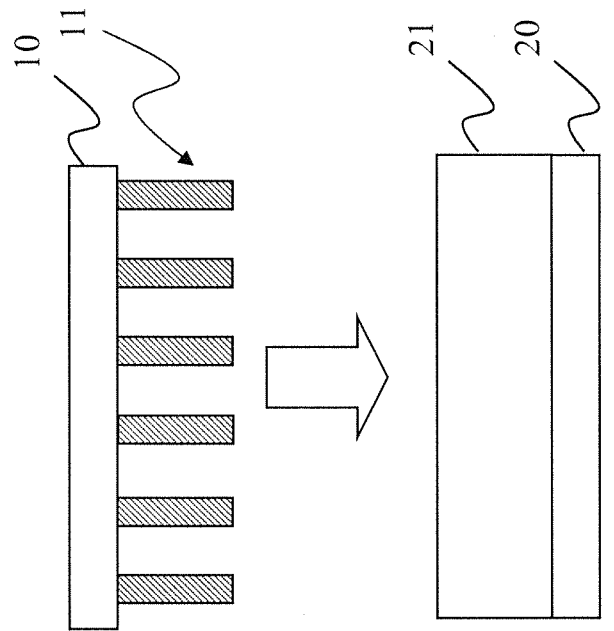

Next, a layer of curable adhesive 21 is coated on a temporary substrate 20, as shown in FIG. 1E. The curable adhesive 21 is a gel or a liquid, which can be cured into a solid. The curable adhesive 21 may be a sol, a gel glue, a melted metal, a polymer, an SOG, a wax, PMMA (polymethylmethacrylate), or P3HT (poly(3-hexylthiophene)). When the temporary substrate 20 is made of a heat-resistant material, the curable adhesive 21 may adopt a melted metal. Next, the semiconductor micro/nanostructure array 11 of the source-material wafer 10 is inserted into the curable adhesive 21, as shown in FIG. 1F. Then, the curable adhesive 21 on the temporary substrate 20 is cured. The temporary substrate 20 may be made of a semiconductor, a conductive material (including a metal), an insulating material, or any material on which a liquid or gel can be cured into a solid.

Figure 1G:
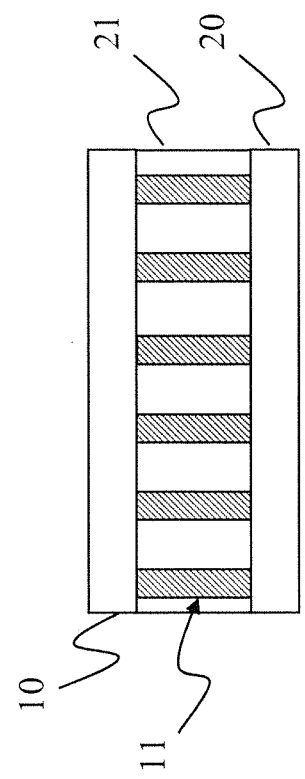
Figure 2:
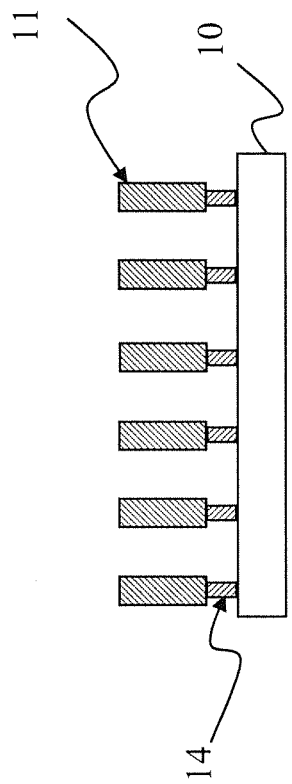
FIG. 2 is a diagram schematically showing that a selectively-etched layer is additionally formed in the micro/nanostructure PN junction diode array thin-film solar cell according to one embodiment of the present invention.
Figure 1H:
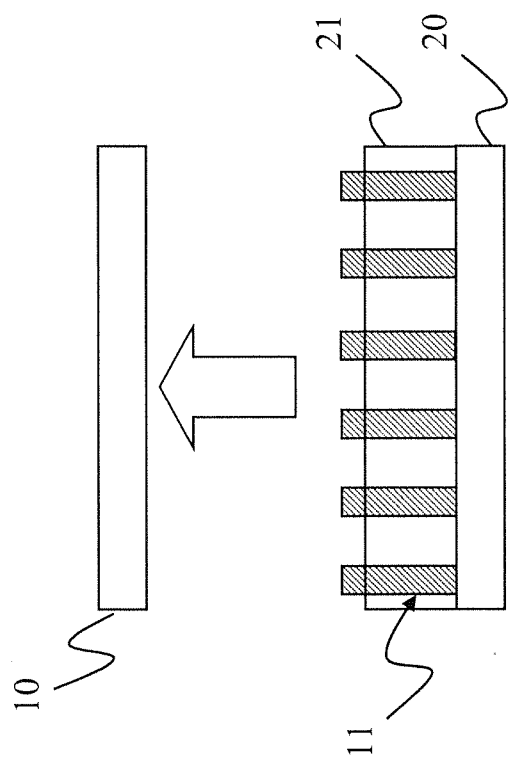

Next, the semiconductor micro/nanostructure array 11 is separated from the source-material wafer 10 and transferred to the temporary substrate 20, as shown in FIG. 1G and FIG. 1H. The semiconductor micro/nanostructure array 11 may be maintained about vertical to the temporary substrate 20. The semiconductor micro/nanostructure array 11 can be separated from the source-material wafer 10 via ultrasonic vibration, slight knocking, or chemical etching. If the semiconductor micro/nanostructure array 11 is firmly bonded to the curable adhesive 21, the semiconductor micro/nanostructure array 11 can be separated from the source-material wafer 10 via directly lifting the source-material wafer 10. If the semiconductor micro/nanostructure array 11 is tough and unlikely to be broken by knocking or ultrasonic vibration, a selectively-etched layer 14 is formed in between the semiconductor micro/nanostructure array 11 and the source-material wafer 10, as shown in FIG. 2. Then, the semiconductor micro/nanostructure array 11 can be separated from the source-material wafer 10 via etching away the selectively-etched layer 14 with a chemical method, such as a wet etching method or a dry etching method, without seriously damaging the semiconductor micro/nanostructure array 11 and the source-material wafer 10. The semiconductor micro/nanostructure array 11 can also be separated from the source-material wafer 10 with a combination of the abovementioned methods.

Refer to from FIG. 3A to FIG. 3G diagrams schematically showing a method for fabricating a micro/nanostructure PN junction diode array thin-film solar cell according to one embodiment of the present invention.

Suppose the semiconductor micro/nanostructure array 11 is of an N-type semiconductor, or suppose the semiconductor micro/nanostructure array 11 is a PN-diode array with the N-type semiconductor at the top. The fabrication steps thereof are described below. Firstly, a layer of thin-film N-type semiconductor 31 is coated on a first transparent substrate 30, as shown in FIG. 3A. The thin-film N-type semiconductor 31 is an elemental semiconductor, a binary compound semiconductor, a ternary compound semiconductor, a quaternary compound semiconductor, or a combination of the abovementioned semiconductors, such as silicon, germanium, gallium arsenide, indium phosphide, gallium phosphide, gallium antimonide, or zinc telluride. Alternatively, the thin-film N-type semiconductor 31 is an organic semiconductor, such as 2-phenyl-5-(4-biphenylyl)-1,3,4-oxadiazole (PBD), aluminum tris(8-hydroxyquinoline) (Alq3), (1-(3-methoxycarbonyl)-propyl-1-1-phenyl-(6,6)C61) (PCBM), 4,4'-bis(2,2'diphenyl vinyl)-1,1'-biphenyl (DPVBi), beryllium-quinoline complex (Beq2), Aluminum(III) bis(2-methyl-8-quinolinate)4-phenylphenolate (Balq), oxadiazole (OXD), or 2,5-bis(tert-butyl-2-benzoxazolyl)thiophene (BBOT). If the organic semiconductor is a small molecule material, it can be blended with a polymeric material, such as PMMA (polymethylmethacrylate) or polystyrene, to improve its film-forming property. Next, as shown in FIG. 3B, the semiconductor micro/nanostructure array 11 on the temporary substrate 20 is joined to the thin-film N-type semiconductor 31 on the first transparent substrate 30. Then, an intense laser beam 70 penetrates the first transparent substrate 30 to illuminate the thin-film N-type semiconductor 31 and the semiconductor micro/nanostructure array 11. The laser beam 70 has such an intensity that the thin-film N-type semiconductor 31 and the top of the semiconductor micro/nanostructure array 11 are melted with the first transparent substrate 30 maintained unmelted. Then, the laser is turned off, and the thin-film N-type semiconductor 31 and the semiconductor micro/nanostructure array 11 are cooled down. Thus, the thin-film N-type semiconductor 31 and the top of the semiconductor micro/nanostructure array 11 are solidified and bonded together, as shown in FIG. 3C.

Figure 3D:
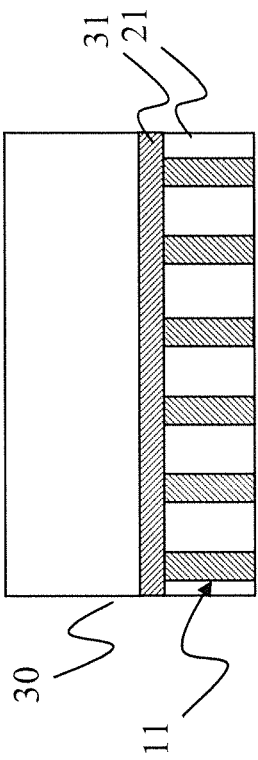
Figure 3C:
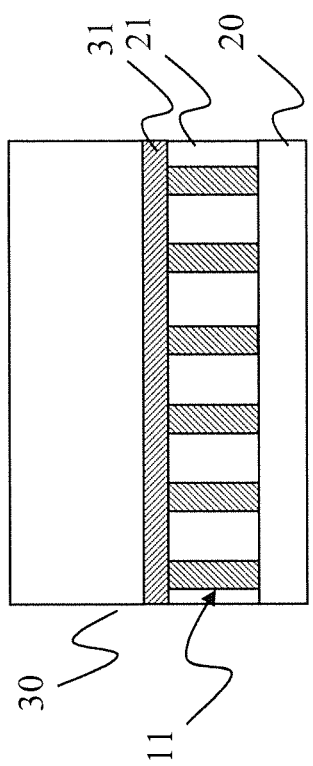

Next, as shown in FIG. 3D, the cured curable adhesive 21 on the temporary substrate 20 is removed with a solvent, and the semiconductor micro/nanostructure array 11 is then detached from the temporary substrate 20. Thus, the semiconductor micro/nanostructure array 11 turns to adhere to the first transparent substrate 30, and the thin-film N-type semiconductor 31 of the first transparent substrate 30 is joined to the N-type ends of the semiconductor micro/nanostructure array 11. The semiconductor micro/nanostructure array 11 may be alternatively detached from the temporary substrate 20 with sticking force, stress, chemical etching or laser melting.

Figure 3F:
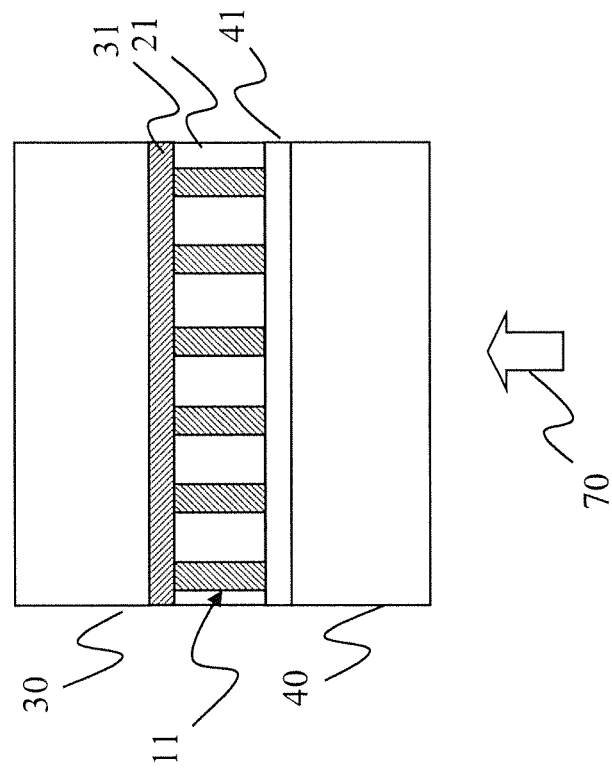
Figure 3E:
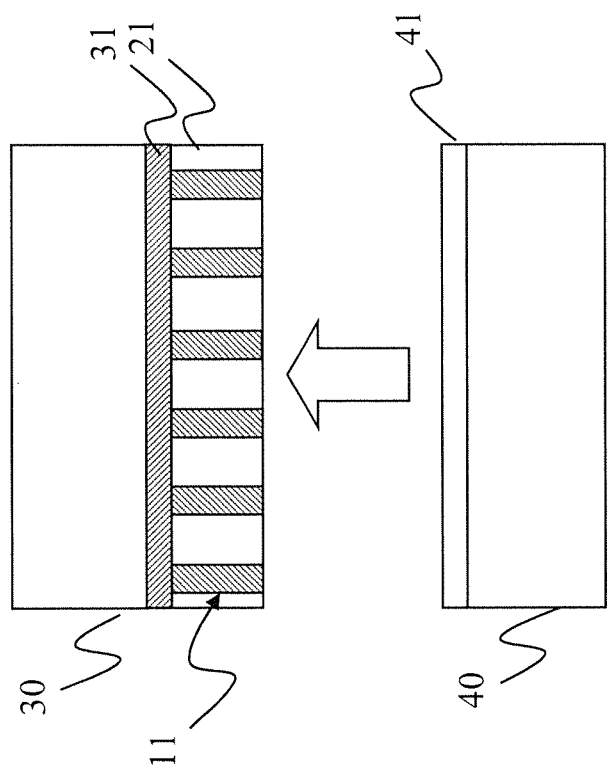

Next, a layer of thin-film P-type semiconductor 41 is coated on a second transparent substrate 40. The thin-film P-type semiconductor 41 is an elemental semiconductor, a binary compound semiconductor, a ternary compound semiconductor, a quaternary compound semiconductor, or a combination of the abovementioned semiconductors, such as silicon, germanium, gallium arsenide, indium phosphide, gallium phosphide, gallium antimonide, or zinc telluride. Alternatively, the thin-film P-type semiconductor 41 is an organic semiconductor, such as poly(3-hexylthiophene) (P3HT), poly[2-methoxy-5-(2'-ethyl-hexyloxy)-1,4-phenylene vinylene] (MEH-PPV), poly[2-metoxy-5-(3',7'-dimethyloctyloxy)-p-phenylene vinylene] (MDMO-PPV), poly (3,4-ethylenedioxythiophene) (PEDOT), poly(9,9-dioctylfluoreny-2,7-diyl)(PFO), (N,N'-diphenyl-N,N'-bis(3-methyl-phenyl)-1,1'biphenyl-4,4'diamine)(TPD), or N,N'-his-(1-naphthyl)-N,N'-diphenyl-1,1'-biphenyl-4,4'-diamine (NPB). Next, as shown in FIG. 3E, the semiconductor micro/nanostructure array 11 on the first transparent substrate 30 is joined to the thin-film P-type semiconductor 41 on the second transparent substrate 40. Thus, the P-type ends of the semiconductor micro/nanostructure array 11 contact the thin-film P-type semiconductor 41. Next, as shown in FIG. 3F, an intense laser beam 70 penetrates the second transparent substrate 40 to illuminate the thin-film P-type semiconductor 41 and the semiconductor micro/nanostructure array 11. The laser beam 70 has such an intensity that the thin-film P-type semiconductor 41 and the P-type ends of the semiconductor micro/nanostructure array 11 are melted with the second transparent substrate 40 maintained unmelted. Then, the thin-film P-type semiconductor 41 and the semiconductor micro/nanostructure array 11 are cooled down. Thus, the thin-film P-type semiconductor 41 and the P-type ends of the semiconductor micro/nanostructure array 11 are solidified and bonded together, as shown in FIG. 3G.

The abovementioned semiconductor micro/nanostructure array may be alternatively composed of two-PN junction diodes or over two-PN junction diodes; the outmost P-type portions thereof are joined to the thin-film P-type semiconductor, and the outmost N-type portions thereof are joined to the thin-film N-type semiconductor. The gaps of the semiconductor micro/nanostructure array may be filled with a transparent non-conductive material, such as SOG, PMMA, $SiO_2$, $SiO_2$ nanoparticles, SiNx, SiNx nanoparticles, $Al_2O_3$, or $Al_2O_3$ nanoparticles.

To enhance the strength of the semiconductor micro/nanostructure array 11, a non-conductive material, such as PMMA, polyimide, or SOG, is filled into the gaps of the semiconductor micro/nanostructure array 11 adhering to the first transparent substrate 30 before the abovementioned steps. Then, the workpiece is etched to slightly reveal the semiconductor micro/nanostructure array 11 so that the semiconductor micro/nanostructure array 11 can be fused together with the thin-film P-type semiconductor 41 of the second transparent substrate 40. Thus, the non-conductive material replaces the curable adhesive 21 shown in FIG. 3F. The first transparent substrate 30 and the second transparent substrate 40 are made of an identical material or different materials. Each of the first transparent substrate 30 and the second transparent substrate 40 is made of a flexible/inflexible slightly light-permeable material, such as a plastic plate, a glass plate, a quartz plate, or the abovementioned material coated with a transparent conductive film, e.g. ITO (Indium Tin Oxide) PET (poly(ethylene terephthalate)), ITO glass, FTO (Fluorine-doped Tin Oxide) glass, ITO quartz, and FTO quartz. In addition to the laser method, the semiconductor micro/nanostructure array 11 and the thin-film N/P-type semiconductor 31 or 41 can be fused together with another method. In addition to being heated after contact, the thin-film N/P-type semiconductor 31 or 41 can be heated and melted into a liquid in advance before the semiconductor micro/nanostructure array 11 contacts the thin-film N/P-type semiconductor 31 or 41.

In the embodiment described, the semiconductor micro/nanostructure array 11 is assumed to be made of an N-type semiconductor, or the semiconductor micro/nanostructure array 11 is assumed to be made of PN diodes with the N-type portions thereof at the top. For the case that the semiconductor micro/nanostructure array 11 is made of a P-type semiconductor or made of PN diodes with the P-type portions thereof at the top, the fabrication steps thereof can be deduced from the abovementioned method and will not repeat herein.

Thus is completed a micro/nanostructure PN junction diode array thin-film solar cell shown in FIG. 3G, and the structure thereof comprises a first transparent substrate 30, a thin-film N-type semiconductor 31, a semiconductor micro/nanostructure array 11, a thin-film P-type semiconductor 41, and a second transparent substrate 40. The abovementioned micron, submicron, or nanometric semiconductor structure can be obtained via etching a chip having superior crystallinity or obtained with a high-quality epitaxial method; therefore, the micron, submicron, or nanometric semiconductor structure has the advantages of a crystalline semiconductor. After the micron, submicron, or nanometric semiconductor structure is separated from the original semiconductor substrate, the original semiconductor substrate can be reused. As the micro/nanostructure PN junction diode array thin-film solar cell of the present invention needs only the micron, submicron, or nanometric semiconductor structure to realize its functions, the present invention does not consume a lot of semiconductor material. When the micron, submicron, or nanometric structure is made of a silicon semiconductor, the micron, submicron, or nanometric semiconductor structure thin-film solar cell is a silicon solar cell and has a performance equivalent to that of a common silicon solar cell. When the micron, submicron, or nanometric structure is made of a gallium arsenide semiconductor, the micron, submicron, or nanometric semiconductor structure thin-film solar cell is a gallium arsenide solar cell and has a performance equivalent to that of a common gallium arsenide solar cell. The above conclusion also applies to the micron, submicron, or nanometric structure made of another semiconductor material.

Alternatively, a mesh-like metal electrode 32 and a mesh-like metal electrode 42 are respectively formed on the first transparent substrate 30 and the second transparent substrate 40 before the thin-film N-type semiconductor 31 and the thin-film P-type semiconductor 41 are coated on the first transparent substrate 30 and the second transparent substrate 40, as shown in FIG. 4. Thus is enhanced the electric conduction of the thin-film N-type semiconductor 31 and the thin-film P-type semiconductor 41. The ratio of the area of the mesh-like metal electrode 32 or 42 to the total area should be small lest the mesh-like metal electrode 32 or 42 block too much sunlight and decrease the photoelectric conversion efficiency.

Figure 5:
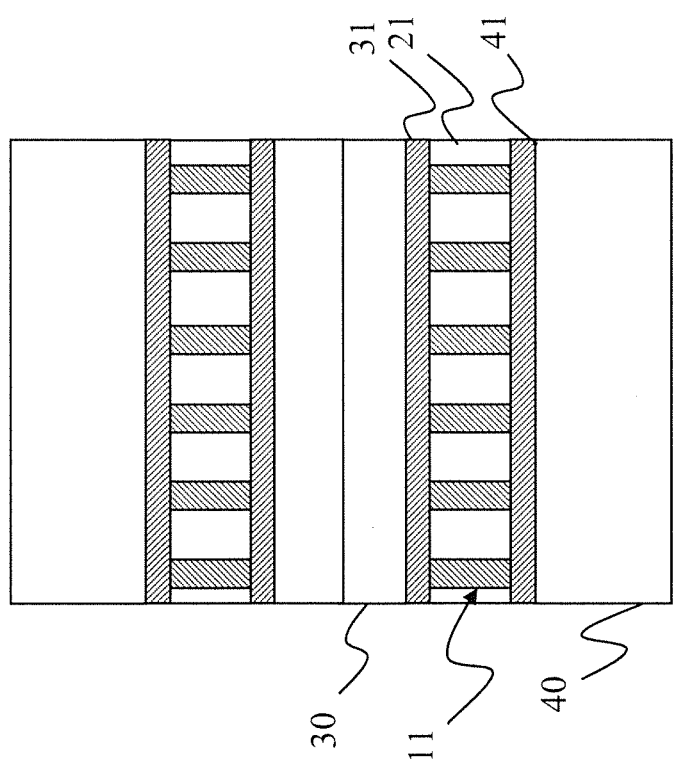
FIG. 5 is a diagram schematically showing that several micro/nanostructure PN junction diode array thin-film solar cells are stacked up according to one embodiment of the present invention.

Refer to FIG. 5. In another embodiment, several micro/nanostructure PN junction diode array thin-film solar cells are stacked up, wherein each micro/nanostructure PN junction diode array thin-film solar cell absorbs a specified waveband of sunlight. Thereby, the stack can almost absorb the complete sunlight spectrum and make the best of sunlight energy. As the solar cell stack needn't consider the lattice matching problem of crystal growth, the solar cell stack is more easy-to-fabricate than the conventional III-V group tandem solar cell. Thus, a plurality of micro/nanostructure PN junction diode array thin-film solar cells of the present invention can be stacked to fully exploit sunlight energy. Therefore, the stack design of solar cells should have a great potential in future. In stacking the solar cells, the upper and lower mesh-like metal electrodes should coincide lest the sunlight absorption of the lower non-metal electrode area be impaired by the upper mesh-like metal electrode.

For the fabrication of inorganic nanowires, the micron, submicron, or nanometric semiconductor structure can be obtained via etching a chip having superior crystallinity or obtained with a high-quality epitaxial method. The etching methods may be categorized into the pure chemical etching methods (such as the wet etching method or the remote plasma photoresist lift-off method), the pure physical etching methods (such as the argon ion bombarding method), or the intermediary reactive ion etching method.

The etching methods may also be categorized into the dry etching methods and the wet etching methods. In the dry etching methods, reactive gases are used to remove unwanted material via a physical etching process, a chemical etching process, or a combination thereof, such as the RIE (Reactive Ion Etching) process or the HDP (High-Density Plasma) process. In the wet etching methods, chemical solutions are used to dissolve the unwanted material via an electrochemical etching process or a photoelectrochemical etching process. For example, a wet electrochemical etching process may be used to fabricate nanowire arrays from a silicon substrate, and a solution of silver nitrate and hydrofluoric acid is used as the etching solution, wherein silver ions are electrolessly deposited on the silicon substrate from the solution of silver nitrate, and hydrofluoric acid etches the regions where silver ions deposit. Such a method can fabricate a large-area product and has a low cost. Below are introduced several methods for fabricating an etching mask, in addition to the photolithographic method that patterns a photoresist into a mask. One method is adjusting the viscosity of a colloidal suspension containing silicon dioxide nanoparticles or polymeric nanoparticles and spin-coating the colloidal suspension on an inorganic substrate to form a monolayer-nanoparticle etching mask. Another method is plating a very thin metal layer on an inorganic semiconductor substrate and fast annealing the metal layer to obtain an etching mask of nanoislands. Besides, the AAO method, electrochemical methods and CVD methods may also be used to fabricate an etching mask.

The embodiments described above are only to exemplify the present invention but not to limit the scope of the present invention. Any equivalent modification or variation according to the spirit of the present invention is to be also included within the scope of the present invention, which is based on the claims stated below.

What is claimed is:

1. A method for fabricating a micro/nanostructure PN junction diode array thin-film solar cell comprising steps:
   providing a source-material wafer having a semiconductor micro/nanostructure array;
   coating a thin-film N-type semiconductor on a first transparent substrate;
   making said semiconductor micro/nanostructure array contact said thin-film N-type semiconductor of said first transparent substrate;
   fusing together said thin-film N-type semiconductor and one side of said semiconductor micro/nanostructure array;
   detaching said semiconductor micro/nanostructure array from said source-material wafer and transferring said semiconductor micro/nanostructure array to said thin-film N-type semiconductor of said first transparent substrate;
   coating a thin-film P-type semiconductor on a second transparent substrate;
   making said semiconductor micro/nanostructure array contact said thin-film P-type semiconductor of said second transparent substrate; and
   fusing together said thin-film P-type semiconductor and another side of said semiconductor micro/nanostructure array to form said micro/nanostructure PN junction diode array thin-film solar cell.

2. The method for fabricating a micro/nanostructure PN junction diode array thin-film solar cell according to claim 1, wherein said step of fusing together said thin-film N-type semiconductor and one side of said semiconductor micro/nanostructure array or said step of fusing together said thin-film P-type semiconductor and another side of said semiconductor micro/nanostructure array is realized with laser illumination or with heating and pressing.

3. The method for fabricating a micro/nanostructure PN junction diode array thin-film solar cell according to claim 1, wherein each of said thin-film N-type semiconductor and said thin-film P-type semiconductor is made of a material selected from a group consisting of silicon, germanium, gallium arsenide, indium phosphide, gallium phosphide, gallium antimonide, zinc telluride, an elemental semiconductor, a binary compound semiconductor, a ternary compound semiconductor, a quaternary compound semiconductor, and a combination of semiconductor materials mentioned above;
   wherein said semiconductor micro/nanostructure array is made of a material selected from a group consisting of silicon, germanium, gallium arsenide, indium phosphide, gallium phosphide, gallium antimonide, zinc telluride, an elemental semiconductor, a binary compound semiconductor, a ternary compound semiconductor, a quaternary compound semiconductor, and a combination of semiconductor materials mentioned thereof;
   wherein each of said first transparent substrate and said second transparent substrate is made of a material selected from a group consisting of a plastic plate, a glass plate, a quartz plate, a plastic plate coated with a transparent conductive film, a glass plate coated with a transparent conductive film, and a quartz plate coated with a transparent conductive film;
   wherein said transparent conductive film is made of Indium Tin Oxide or Fluorine-doped Tin Oxide; and wherein said source-material wafer is made of a material selected from a group consisting of silicon, germanium, gallium arsenide, indium phosphide, gallium phosphide, gallium antimonide, zinc telluride, an elemental semiconductor, a binary compound semiconductor, a ternary compound semiconductor, a quaternary compound semiconductor, and a combination of semiconductor materials mentioned thereof.

4. The method for fabricating a micro/nanostructure PN junction diode array thin-film solar cell according to claim 1, wherein said thin-film N-type semiconductor is made of a small molecule organic semiconductor material selected from a group consisting of 2-phenyl-5-(4-biphenylyl)-1,3,4-oxadiazole, aluminum tris(8-hydroxyquinoline), (1-(3-methoxycarbonyl)-propyl-1-1-phenyl-(6,6)C61), 4,4'-bis(2,2'diphenyl vinyl)-1,1'-biphenyl, beryllium-quinoline complex, Aluminum(III) bis(2-methyl-8-quinolinate)4-phenylphenolate, oxadiazole, or 2,5-bis(tert-butyl-2-benzoxazolyl)thiophene; and, wherein said thin-film P-type semiconductor is made of a small molecule organic semiconductor material selected from a group consisting of poly(3-hexylthiophene), poly[2-methoxy-5-(2'-ethyl-hexyloxy)-1,4-phenylene vinylene], poly[2-metoxy-5-(3',7'-dimethyloctyloxy)-p-phenylene vinylene], poly(3,4-ethylenedioxythiophene), poly(9,9-dioctylfluoreny-2,7-diyl), (N,N'-diphenyl-N,N'-bis(3-methyl-phenyl)-1,1'biphenyl-4,4'diamine), or N,N'-his-(1-naphthyl)-N,N'-diphenyl-1,1'-biphenyl-4,4'-diamine.

5. The method for fabricating a micro/nanostructure PN junction diode array thin-film solar cell according to claim 1, wherein said semiconductor micro/nanostructure array is formed with an epitaxial method, a doping method, an etching method, or a crystal growth method;

wherein said etching method is a dry etching method, a wet etching method, a physical etching method, a chemical etching method, or a combination thereof; and wherein a mask used by said etching method is a photoresist patterned with a photolithographic technology, spin-coated nanoparticles, nanoislands formed via rapidly annealing a coated metal film, a template fabricated with an Anodic Aluminum Oxide method, a template fabricated with an electrochemical Chemical Vapor Deposition method.

6. The method for fabricating a micro/nanostructure PN junction diode array thin-film solar cell according to claim 1 further comprising steps:

coating a curable adhesive on a temporary substrate, wherein said temporary substrate is made of a semiconductor material, a conductive material, or an insulating material;

inserting said semiconductor micro/nanostructure array of said source-material wafer into said curable adhesive of said temporary substrate;

curing said curable adhesive, wherein said curable adhesive is a sol, a gel glue, a melted metal, a polymer, an Spin-On-Glass, a wax, polymethylmethacrylate, or P3HT; and separating said semiconductor micro/nanostructure array from said source-material wafer and transferring said semiconductor micro/nanostructure array to said temporary substrate, wherein said semiconductor micro/nanostructure array is separated from said source-material wafer via ultrasonic vibration, slight knocking, chemical etching, or directly lifting said source-material wafer; and wherein the step of detaching said semiconductor micro/nanostructure array according to claim 1 is detached via sticking force, stress, chemical etching, or laser melting, or dissolving said curable adhesive with a solvent.

7. The method for fabricating a micro/nanostructure PN junction diode array thin-film solar cell according to claim 1, wherein a selectively-etched layer is formed in between said source-material wafer and said semiconductor micro/nanostructure array before said semiconductor micro/nanostructure array is fabricated with an epitaxial process and an etching method; and wherein said semiconductor micro/nanostructure array is separated from said source-material wafer via removing said selectively-etched layer with a chemical etching method or a dry etching method.

8. The method for fabricating a micro/nanostructure PN junction diode array thin-film solar cell according to claim 1, wherein a longitudinal section of said semiconductor micro/nanostructure array has a width of from 1 nm to 3000 μm.

9. The method for fabricating a micro/nanostructure PN junction diode array thin-film solar cell according to claim 1, wherein said semiconductor micro/nanostructure array is made of a P-type semiconductor material or an N-type semiconductor material.

10. The method for fabricating a micro/nanostructure PN junction diode array thin-film solar cell according to claim 1, wherein said semiconductor micro/nanostructure array is an array of diodes each having at least one PN junction; outmost P-type portions of said diodes are joined to said thin-film P-type semiconductor, and outmost N-type portions of said diodes are joined to said thin-film N-type semiconductor; and wherein said semiconductor micro/nanostructure array absorbs different wavebands of sunlight.

11. The method for fabricating a micro/nanostructure PN junction diode array thin-film solar cell according to claim 1 further comprising a step:

stacking another micro/nanostructure PN junction diode array thin-film solar cell on said micro/nanostructure PN junction diode array thin-film solar cell to form a stack structure; and wherein a semiconductor micro/nanostructure array of each said micro/nanostructure PN junction diode array thin-film solar cells absorbs a different waveband of sunlight.

12. The method for fabricating a micro/nanostructure PN junction diode array thin-film solar cell according to claim 1 further comprising a step: filling a transparent non-conductive material into gaps of said semiconductor micro/nanostructure array.

* * * * *